United States Patent

Patel et al.

[11] Patent Number: 5,861,767
[45] Date of Patent: Jan. 19, 1999

[54] DIGITAL STEP GENERATORS AND CIRCUITS, SYSTEMS AND METHODS USING THE SAME

[75] Inventors: Kirit B. Patel; G. R. Mohan Rao, both of Dallas, Tex.

[73] Assignee: Cirrus Logic, Inc., Fremont, Calif.

[21] Appl. No.: 759,764

[22] Filed: Dec. 3, 1996

[51] Int. Cl.[6] .................................................. H03K 4/02
[52] U.S. Cl. ........................ 327/126; 327/334; 327/530
[58] Field of Search .................................. 327/334, 530, 327/306, 403, 404, 51, 55, 57, 126

[56] References Cited

U.S. PATENT DOCUMENTS

| | | | |
|---|---|---|---|
| 4,168,498 | 9/1979 | Kubota et al. | 327/530 |
| 4,446,436 | 5/1984 | Ireland | 328/14 |
| 4,855,628 | 8/1989 | Jun | 327/57 |
| 4,864,162 | 9/1989 | Maoz | 327/530 |
| 5,130,577 | 7/1992 | Neidorff et al. | 327/306 |
| 5,196,732 | 3/1993 | Takahashi et al. | 327/126 |
| 5,546,042 | 8/1996 | Tedrow et al. | 327/530 |

FOREIGN PATENT DOCUMENTS

| | | |
|---|---|---|
| 0448025A2 | 9/1991 | European Pat. Off. . |
| 0448025A3 | 9/1991 | European Pat. Off. . |

OTHER PUBLICATIONS

"A 64–K dynamic RAM needs only one 5–volt supply to outstrip 16–K parts" by G.R. Mohan Rao and John Hewkin, *Electronics*, Sep. 28, 1978 pp. 109–116.

"A 1Mb CMOS DRAM with Design–for–Test Functions" by Neal, Holland, Inoue, Loh, mcAdams,& Potett, ISSC Conv. 1986, Digest of Tech. Papers. pp. 264–265.

"A 4Mb DRAM with Half Internal–Voltage Bitlines Precharge", ISSC Conf. 1986, Digest of Tech. Papers, pp. 270–271.

"High–Speed Sensing Scheme for CMOS DRAM's" by Dhong et al., in the *IEEE Journal of Solid State Circuit*, vol. 23, No. 1, Feb. 1988.

"A 50–ns 16 Mb DRAM with a 10–ns Data Rate and On–Chip ECC" by Kalter et al. *IEEE Journal of Solid State Circuits, vol.25, No. 5 in Oct. 1990.*

"A Variable Precharge Voltage Sensing" by Kirihara et al. *IEE Journal of Solid State Circuits*, vol. 30, No. 1, in Jan., 1995.

"Cross–Coupled Charge–Transfer Sense Amplifier and Latch Sense Scheme or High–Density FET Memories" by Gray, in *IBM J.Res. Develop.*, vol. 24, No. 3, May 1980.

"A 5V–only 64K Dynamic RAM" by White et al. in *IEEE International Solid–State Circuits Conference, 1980*, Friday, Feb. 15, 1980, pp. 230–231.

"Offset–Trimming Bit–Line Sensing Scheme for Gigabit–Scale DRAM's" by Suh et al. in the *IEEE Journal of Solid–State Circuits*, vol. 31, No. 7, Jul. 1996, pp. 1025–1028.

"A Full Bit Prefetch Architecture for Synchronous DRAM's" by Sunaga et al., *IEEE Journal of Solid–State Circuits*, vol. 30, No. 9, Sept. 1995, pp. 998–1005.

"DRAM Macros for ASIC Chips" by Sunaga et al., *IEEE Journal of Solid State Circuits*, vol. 30, No. 9, Sep. 1995 pp. 1006–1014.

*Primary Examiner*—Toan Tran
*Attorney, Agent, or Firm*—James J. Murphy; Steven A. Shaw

[57] ABSTRACT

A step generator 800 including at least one gate 805 and a voltage divider 806 coupled to an output of gate 805. The selected node of voltage divider 806 provides an output $V_{OUT}$ of generator 800. Circuitry 801 presents a signal to an input of gate 805 to initiate current flow through voltage divider 806.

17 Claims, 9 Drawing Sheets

DIGITAL STEP GENERATORS AND CIRCUITS, SYSTEMS AND METHODS USING THE SAME

CROSS-REFERENCE TO RELATED APPLICATION

The following co-pending and co-assigned application contains related information and is hereby incorporated by reference: Ser. No. 08/759,760 (Attorney Docket No. 2836-P053US), entitled PRECISION SENSE AMPLIFIERS AND MEMORIES, SYSTEMS AND METHODS USING THE SAME, filed Dec. 3, 1996.

TECHNICAL FIELD OF THE INVENTION

The present invention relates in general to electronic circuits and in particular to digital step generators and circuits, systems and methods using the same.

BACKGROUND OF THE INVENTION

In applications where access time is not critical, dynamic random access memory devices (DRAMs) have several advantages over other types of memories, in particular, static random access memories (SRAMs). In comparison to SRAMs, DRAMs are less expensive, consume substantially less power, and provide more bits in the same chip space (i.e. have a higher cell density). Hence, DRAMs are normally used to construct those memory subsystems, such as system memories and display frame buffers, where power conservation and high cell density are more critical than speed. In most computing systems, it is these subsystems which dominate the system architecture, and thus, DRAMs are the prevalent type of memory device on the market.

The cells of the typical DRAM array are arranged in rows and columns. A row is selected for access by activating a corresponding conductive wordline. Data accesses (reads and writes) are made to the cells of the selected row through conductive bitlines associated with each of the corresponding columns. Conventionally, each bitline is formed by a pair of half-bitlines. The cells coupled to one half-bitline form part of one set of rows, for example the even rows, and are therefore controlled by the corresponding set of even wordlines. Similarly, the cells coupled to the other half-bitline form part of a second set of rows, for example the odd rows, and are controlled by the corresponding set of even wordlines. A differential sense amplifier is provided to sense the voltage difference between each half-bitlines pair during an access.

Wordline activation is by row address, as decoded by a row decoder. Typically, all cells of a selected row are activated and their data sensed and latched by the sense amplifiers. A column decoder coupled to the sense amplifiers selects one or more of the physical columns for access in response to a column address. For example, in a "by 8" device, eight physical columns are accessed per column address.

The vast majority of DRAMs require two operational time periods per row access (precharge and active), as timed by a row address strobe (/RAS) and a column address strobe (/CAS). These two periods together constitute one cycle. When /RAS is in a logic high state, the DRAM device is in a precharge cycle, during which the nodes of various dynamic circuits, such as those used in the column and row decoders, are pulled to a predetermined voltage. Most importantly, during the precharge cycle the bitlines of the cell array are voltage equalized. Then, when /RAS transitions to a logic low, the device enters the active cycle. In Synchronous DRAM's, where a master clock controls the operations, /RAS and/CAS are timed off that particular master clock.

Typically, during the active cycle, the row address bits are presented to the address pins and latched into the DRAM device with the falling edge of /RAS. After a very small delay for set up, the column address bits are presented at the address pins and latched-in with the falling edge of /CAS. A short time thereafter the addressed cells (location) can be accessed. During page mode, additional column addresses are input with additional falling edges of /CAS (/CAS cycling) to access a series of "pages" along the selected row. At the end of the active cycle, /RAS returns to a logic high state and the device re-enters precharge (in any event, when a change in row is required, a complete new /RAS cycle, including a new precharge cycle and a new active cycle must be initiated).

During a voltage-high precharge, all of the half-bitlines in the array are precharged to a predetermined voltage, for example 3.3 volts for a 3.3V Vcc device, and then allowed to float (in some devices, precharge is to substantially zero volts but for purpose of the present discussion, precharge towards Vcc is assumed). Currently, the typical precharge cycle is between 50–60 nsec in length (the typical active row-read or row-write cycle also known as random access cycle is also approximately 50–60 nsec long). While the nodes of most of the dynamic circuitry, such as that used in the row and column decoders, can be charged or discharged within 10 nsecs, the full 50 to 60 nsecs is required Lo precharge and equalize the bitlines of the cell array. A page cycle, or a burst cycle in a Synchronous DRAM could be shorter.

During the active cycle, the wordline selected in response to the received row address is activated and all the cells along the corresponding row are turned on. Tn this disclosure, all logic is positive—namely Logic 0 is $V_{SS}$ and Logic 1 is $V_{CC}$. If the storage capacitor of a given activated cell is at ground potential (a logic 0), the corresponding half-bitline is pulled down slightly relative to the complementary half-bitline (the voltage on which is set by a reference or "dummy" cell). If the storage capacitor of a given active cell is at a higher voltage (a logic 1) the corresponding half-bitline is pulled up slightly (or maintained at $V_{CC}$) relative to its complementary half-bitline. During a read or refresh, the sense amplifiers differentially detects the voltage difference between each half-bitline pair and latch one half-bitline of the pair to a full logic high and the other to a full logic low, depending on the direction of the swing. During a write of a logic 0, the sense amplifiers pull down the half-bit-line which is to carry the logic zero and latch-high the other half-bitline. A write of a logic 1 is similar.

The voltage swings caused by the cell storage capacitors on the bitlines are extremely small. The typical storage cell capacitor has a capacitance of approximately 25–35 fF (fentofarads) while the half-bitline it couples with has a capacitance of approximately 300–500 fF. Therefore, to avoid incorrect sensing of the stored logic state, the precharge voltage on each bitline pair must be equalized during precharge as closely as possible. Notwithstanding, some voltage imbalance will always exist, often on the order of 2 to 3 millivolts. For example, constraints on the chip fabrication processes result in differences in the resistance and capacitance between the half-bitlines in each half-bitline pair. Similarly, the widths and lengths of the channels, and thus threshold voltages and gains, will vary between the (cross coupled) transistors in the sense amplifiers.

Additional problems must be accounted for during sensing. For example, it would be desirable to turn-on the sense amplifiers very quickly (e.g. on the order of 5 nanoseconds) to provide a short access time. However, if the "bottom" transistor controlling current flow through the sense amplifier differential transistor pair is turned on rapidly, capacitive coupling effects can cause unwanted voltages to couple to half-bitlines and cause mis-sensing.

Thus, the need has arisen for precision sense amplifier circuitry and methods and systems using the same. Among other things, such circuitry and methods should allow for fast, accurate sensing. In particular, problems associated with the differential sensing of small voltages should accounted for while minimizing the coupling of noise voltage from the bottom capacitor. These circuits and methods should preferably be applicable to DRAMs, but should also be adaptable for use in other types of memories, such as SRAMs.

SUMMARY OF THE INVENTION

According to a first embodiment of the present invention, a step generator is provided which includes at least one gate and a voltage divider coupled to an output of the gate. The selected node of the voltage divider provides an output to the generator. Circuity is also included for presenting a signal to an input of the gate to initiate current flow through the voltage divider.

According to another embodiment of the principles of the present invention, circuitry for generating voltage steps is provided which includes a plurality of logic gates and a voltage divider. The voltage divider has a plurality of nodes, a selected one of the nodes coupled to an open-drain output of the corresponding one of the gates. A circuit output is coupled to a selected one of the nodes of the voltage divider. The circuitry for regenerating voltage steps also includes a plurality of flip-flops for presenting a plurality of signals to inputs of the logic gates, selected combination of the signals causing the open-drain output of a selected gate to sink current from the corresponding node of the voltage divider.

The principles of the present invention are also embodied in a voltage step generator which includes n-number of gates for generating n-number of voltage steps, each of the gates having open-drain output. The voltage divider is coupled to a preselected supply voltage and has n-number of nodes, each of the nodes coupled to the open-drain output of a corresponding one of the gates to provide a voltage step of a preselected voltage. A plurality of flip-flops are included for sequentially generating at least n-number of sets of signals, each set of signals causing the open-drain output of a selected one of the gates to sink current from the corresponding one of the nodes of the voltage divider. The generator output is coupled to a selected one of the nodes of the voltage divider.

The principles of the present invention are additionally embodied in a sense amplifier. According to this embodiment, a first transistor has a current path coupled to a first sensing node and a control terminal coupled to a second sensing node. A second transistor has a current path coupled to the second sensing node and a control terminal coupled to the first sensing node. The sense amplifier further includes a bottom transistor having a current path coupled to the current paths of the first and second transistors and a control terminal. A stepped voltage generator is coupled to the control terminal of the bottom transistor, the stepped voltage generator including at least one gate having an open-drain output, the voltage divider coupled to the open-drain output, and circuitry for presenting a time varying signal to an input of the gate. A selected node of the voltage divider provides an output to the voltage generator and couples the step voltage generator to the control terminal of the bottom transistor.

The principles of the present invention provide substantial advantages over the prior art. Among other things, digital voltage stepped generators embodying these principles are substantially faster than the prior art analog step voltage generators. Further, such digital step generators can be constructed from either discrete components or integrated on-chip. Further, by suitably selecting the resistor values and the number of gates and flip-flops, the number of voltage steps and/or the voltage of each step can be suitably selected.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–7 of the drawings, in which like numbers designate like parts. While memory devices embodying the principles of the present invention are useful in a wide number of applications, for purposes of illustration, such memory devices will be described in conjunction with a basic processing system architecture typically employed in personal computers.

Figure 1A:
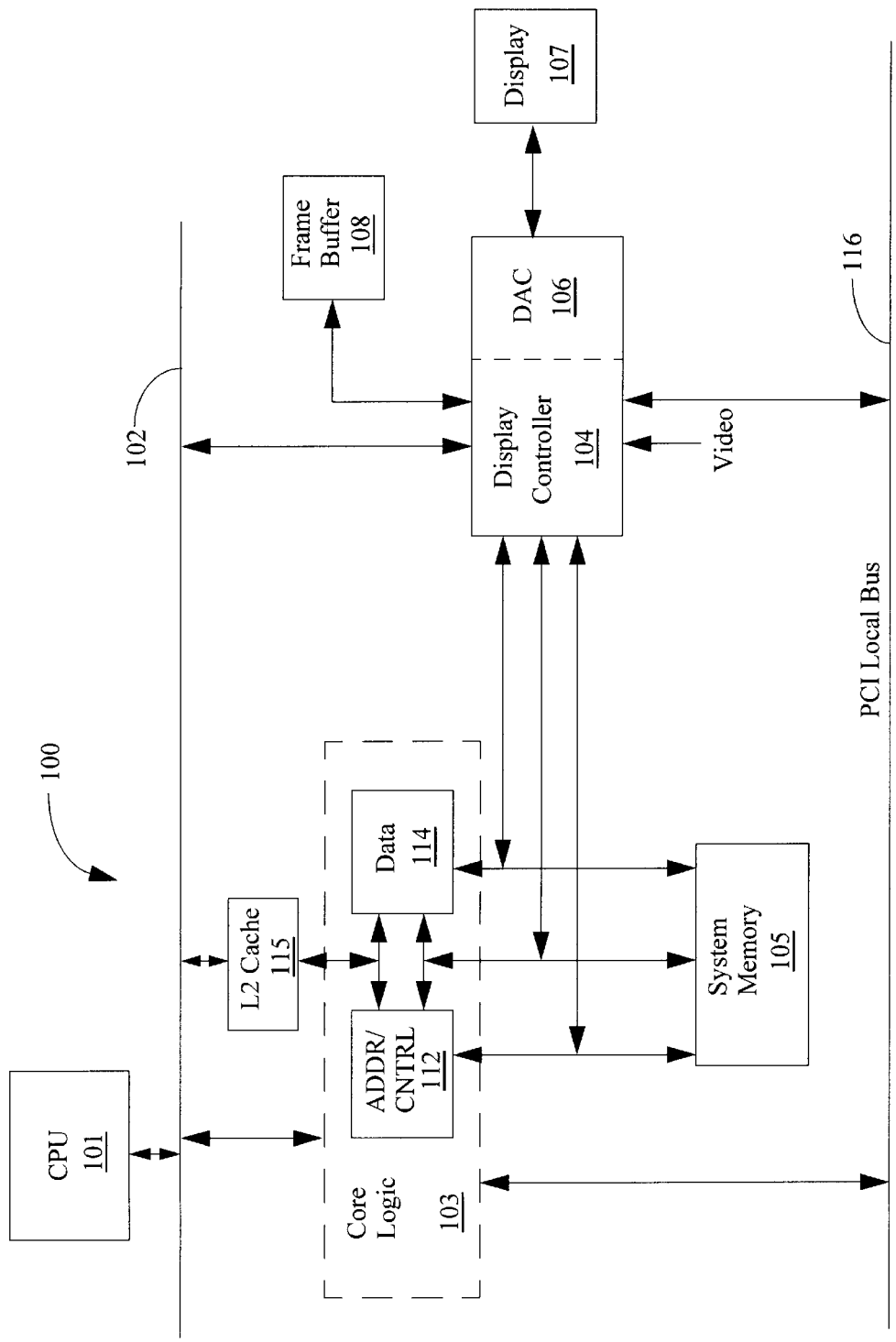
FIGS. 1A and B are high level functional block diagrams of exemplary data processing systems embodying the principles of the present invention.

FIG. 1a is a high level functional block diagram of a portion of a processing system 100. System 100 includes a central processing unit 101, a CPU local bus 102, core logic 103, a display controller 104, a system memory 105, a digital to analog converter (DAC) 106, frame buffer 108, a display device 107 and an optional display device 107.

CPU 101 is the "master" which controls the overall operation of system 100. Among other things, CPU 101 performs various data processing functions and determines the content of the graphics data to be displayed on display unit 107 in response to user commands and/or the execution of application software. CPU 101 may be for example a general purpose microprocessor, such as an Intel Pentium™ class microprocessor or the like, used in commercial personal computers. CPU 101 communicates with the remainder of system 100 via CPU local bus 102, which may be for example a special bus, or a general bus (common in the industry).

Core logic 103, under the direction of CPU 101, controls the exchange of data, addresses, control signals and instructions between CPU 101, display controller 104, and system memory 105. Core logic 103 may be any one of a number of commercially available core logic chip sets designed for compatibility with the remainder of the system, and in particular with CPU 101. One or more core logic chips, such as chip 112 in the illustrated system, are typically "address and system controller intensive" while one or more core logic chips, such as chip 114 in FIG. 1, are "data intensive." Address intensive core logic chip 112 generally: interfaces CPU 101 with the address path of CPU bus 102; maintains cache memory, including the cache tags, set associative cache tags and other data necessary to insure cache coherency; performs cache "bus snooping"; generates the control signals required for DRAMs in the system memory or cache; and controls general management transactions. Data intensive chip 114 generally: interfaces CPU 101 with the data path of CPU bus 102; issues cycle completion responses to address chip 112 or CPU 101; may abort operations if their cycles are incomplete; and arbitrates for the data path of bus 102.

CPU 101 can directly communicate with core logic 103 or through an external (L2) cache 115. L2 cache 115 may be for example a 256 K Byte fast SRAM device(s). it should be noted that CPU 101 can also include on-board (L1) cache, typically up to 16 kilobytes.

In addition to the conventional functions described above, core logic 103 and/or CPU 101 provide the additional functions described below, either through software programming (such as in the core logic 103) or hardware modification.

Display controller 104 may be any one of a number of commercially available VGA display controllers. For example, display controller 104 may be one of the Cirrus Logic CL-GD754x series of display controllers. The structure and operation of such controllers is described in *CL-GD754x Application Book*, Rev 1.0, Nov. 22, 1994, and *CL-GD7542 LCD VGA Controller Preliminary Data Book*, Rev. 1.0.2, June 1994, both available from Cirrus logic, Inc., Fremont, Calif., and incorporated herein by reference. Display controller 104 may receive data, instructions and/or addresses from CPU 101 either through core logic 103 or directly from CPU 101 through CPU local bus 102. Data, instructions, and addresses are exchanged between display controller 104 and system memory 105 through core logic 103. Further, addresses and instructions may be exchanged between core logic 103 and display controller 104 via a local bus 116 which may be for example a PCI local bus. Generally, display controller 104 controls screen refresh, executes a limited number of graphics functions such as line draws, polygon fills, color space conversion, display data interpolation and zooming, and video streaming, and handles other ministerial chores such as power management. Most importantly, display controller 104 controls the raster of pixel data from frame buffer 108 to display unit 107 during screen refresh and interfaces CPU 101 and frame buffer 108 during display data update. Video data may be directly input into display controller 104.

Digital to analog converter 106 receives digital data from controller 104 and outputs the analog data to drive displays 107a and 107b (when used)in response. In the illustrated embodiment, DAC 106 is integrated with display controller 104 onto a single chip, preferably including a RAMDAC (combination digital-to-analog-converter and palette RAM) and phase locked loop (PLL). Depending on the specific implementation of system 100, DAC 106 may also include a color palette, YUV to RGB format conversion circuitry, and/or X- and Y- zooming circuitry, to name a few options. Displays 107 may be for example a CRT unit, a liquid crystal display, electroluminescent display, plasma display, or other type of display device which displays images on a screen as a plurality of pixels. It should also be noted that in alternate embodiments, "display" 107 may be another type of output device such as a laser printer or similar document view/print appliance.

The data paths in system 100 will vary with each design. For example, system 100 may be a "64-bit" or "72-bit" system. Assume for discussion purposes that a 64-bit system is chosen. Then, each of the data connections, including the data paths of CPU bus 102 and PCI bus 116, the data paths through core logic 103 to system memory 109 and display controller 104, and the data interconnection between display controller 104 and frame buffer 108, are all 64 bits wide. It should be noted that the address interconnections will vary depending on the size of the memory and such factors as the need to support data byte select, error detection correction, and virtual memory operations.

Figure 1B:
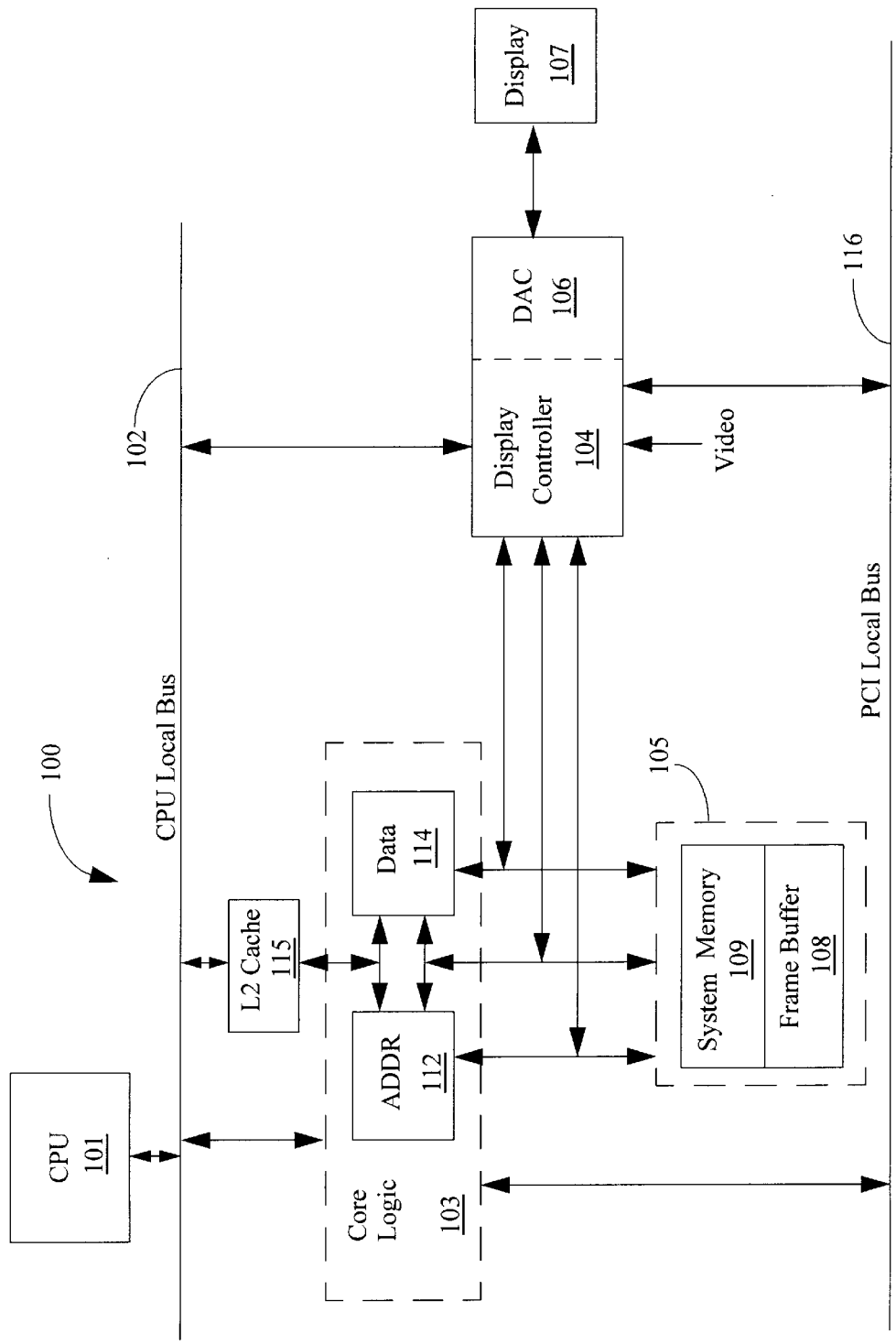

FIG. 1B is an alternate system architecture of system 100 to which the principles of the present invention may advantageously be applied. In this example, memory 105 is a "unified" memory system since the system memory 109 and frame buffer 108 are collocated in a single integrated circuit or bank of integrated circuits. This is in contrast to those systems in which the frame buffer is separate and apart from the system memory and interfaces with the remainder of the system through the display controller. System memory 109 again is preferably a traditional system memory which stores data, addresses, and instructions under the command of CPU 101 as required for executing various processing functions and applications programs. As in traditional systems, the frame buffer 108 stores the pixel data required to generate the required images on the screen of display unit 107.

Figure 2:
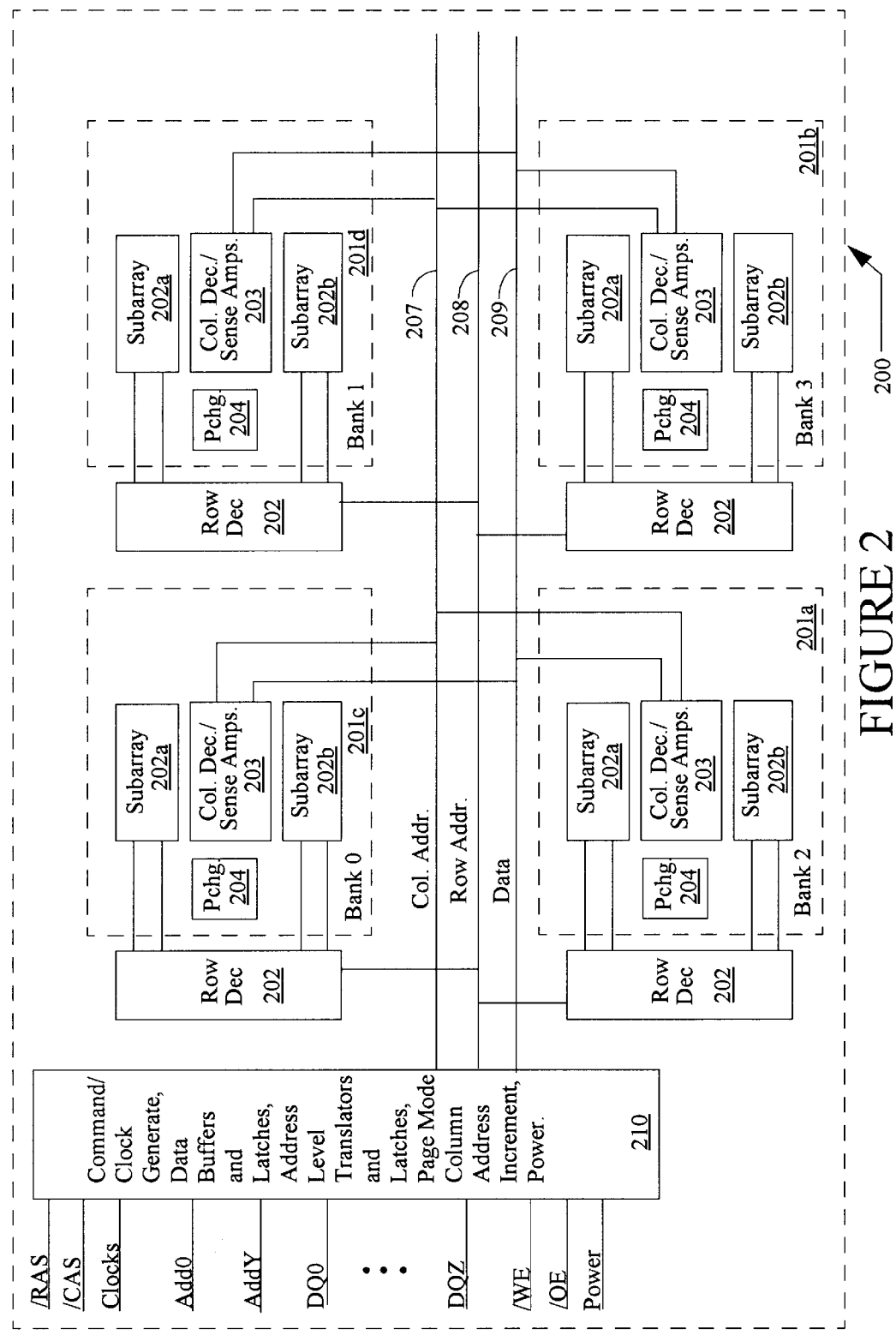
FIG. 2 is a more detailed block functional diagram of an exemplary memory device according to the principles of the present invention.

FIG. 2 is a high level functional block diagram of a memory subsystem (device) 200 embodying the principles of the present invention. Memory 200 may be used for example in the construction of either system memory 105 and/or display frame buffer 108 in the system of FIG. 1A or the unified memory 105 of FIG. 1B, to name a few examples. In the preferred embodiment, memory subsystem 200 is fabricated as a single integrated device (chip), although the present inventive principles are not limited to such single chip embodiments.

In the preferred embodiment, memory subsystem 200 includes one or more memory banks 201. In FIG. 2, four such banks 201, labeled Banks 0–Bank 3, are shown for illustration purposes. In alternate embodiments, the exact number of banks will vary depending on such factors as available chip space, the address space of core logic 103 and the amount of data storage capacity required.

In memory system 200, each memory bank includes two subarrays 202a and 202b of dynamic random access memory (DRAM) cells arranged as M number of rows and N number of columns. The subarrays 202a and 202b of each bank 201 are associated with column decoder/ sense amplifier circuitry 203. In memory subsystem 200, the subarrays 202a and 202b of each bank 201 are coupled to corresponding sense amplifiers in an open-bitline arrangement. For example, each subarray 202a may contain the "true" half-bitlines $BL_M$ and subarray 202b correspondingly would contain the complimentary half-bitlines $\overline{BL_M}$ for the corresponding bank 201.

Each memory bank 201 further contains precharging circuitry 204. Preferably, precharging circuitry 204 is conventional in nature, and includes one or more large pull up transistors per bank 201. A preferred interconnection of precharge circuitry 204 with the bitlines of subarrays 202 is discussed below in conjunction with FIGS. 3 and 5.

The wordlines associated with the rows of cells in each subarray 202 are coupled to and controlled by row decoder circuitry 205. Column addresses are presented to the column decoders 203 via column address bus (lines) 207. Row addresses are coupled to the blocks of row decoder circuitry 205 via a bus (lines) 208. Data is exchanged with an addressed location within the subarrays 202 of a selected bank 201 via a data bus 209 and the corresponding column decoder circuitry 203.

Data, address clocks, and control signals are exchanged with memory subsystem 200 through input/output and control circuitry 210. In system 100, these signals may be received from core logic 103 or display controller 104, depending on whether memory 200 is used as part of the system memory or the frame buffer and/or whether a unified memory architecture is being used. Circuitry 210 includes conventional clock generation circuitry for generating the clocks needed to drive the dynamic circuitry of memory 200. Input/output circuitry 210 further includes conventional data buffers and latches, address level translators and address latches, page mode column incrementation circuitry and circuitry for controlling power distribution. Among the received clocks may be a master clock, if memory 200 is a synchronous DRAM.

Preferably, system 200 is designed for operation with a conventional multiplexed address bus, with row addresses input on the falling edge of /RAS and column addresses input on the falling edge of /CAS. In the illustrated embodiment, subsystem 200 includes a Y-bit wide address port (lines ADD0–ADDY) and a Z-bit wide data port (DQ0–DQZ). Data reads and writes controlled by conventional write enable signal (/WE) and a conventional output enable signal (/OE).

In alternate embodiments groups of one or more banks may be independently controlled using multiple /RAS and /CAS signals. For example, banks 201a and 201b could be controlled by /RAS1 and /CAS1 and banks 202c and 201d could be controlled by /RAS2 and /CAS2. In this embodiment, one pair of banks could be in precharge while the other pair of banks are being accessed, essentially providing for interleaved accesses. Alternatively, a single /RAS signal could be used, with different sets of banks entering precharge/active periods on opposite phases. For example, banks 201a and 201b could precharge during /RAS high and enter the active period during /RAS low, while banks 201c and 201d could precharge during /RAS low and enter the active period during /RAS high.

In the preferred embodiment, row decoders 202, sense amplifiers 203 and column decoders 204 are dynamic circuitry known in the art. Typical dynamic decoding and sensing circuitry are illustrated in "A 5-volt Only 64 k DRAM", L. S. White, N. H. Hong, D. J. Redwine, and G. R. Mohan Rao, International Solid State Circuit Conference 1980, Digest of Technical Papers, pp. 230–231, incorporated herein by reference.

Some of the fundamental principles of DRAM construction and operation are additionally described in: "A 64-k Dynamic RAM Needs Only One 5-volt Supply to Outstrip 16 k Parts", G. R. Mohan Rao and John Hewkin, Electronics, Sep. 28, 1978, pp. 109–116; "A 1 Mb DRAM With Design-For-Test Functions," J. Neal, B. Holland, S. Inoue, W. K. Loh, H. McAdams and K. Poteet, International Solid State Circuit Conference 1986, Digest of Technical Papers, pp. 264–265; "A 4 Mb DRAM With Half Internal-Voltage Bitline Precharge", International Solid State Circuit Conference 1986, Digest of Technical Papers, pp. 270–271; "A Full Bit Prefetch Architecture For Synchronous DRAMs", T. Sunaga, K. Hosokawa, Y. Nakamura, M. Ichinose, A Moriwaki, S. Kakimi and N. Kato, IEEE Journal of Solid State Circuits, Vol 30., No. 9, September 1995, pp. 994–1005; and "DRAM Macros For ASTC Chips", IFEF Journal of Solid State Circuits, Vol 30., No. 9, September 1995, pp. 1006–1014, each incorporated herein by reference.

Figure 3:
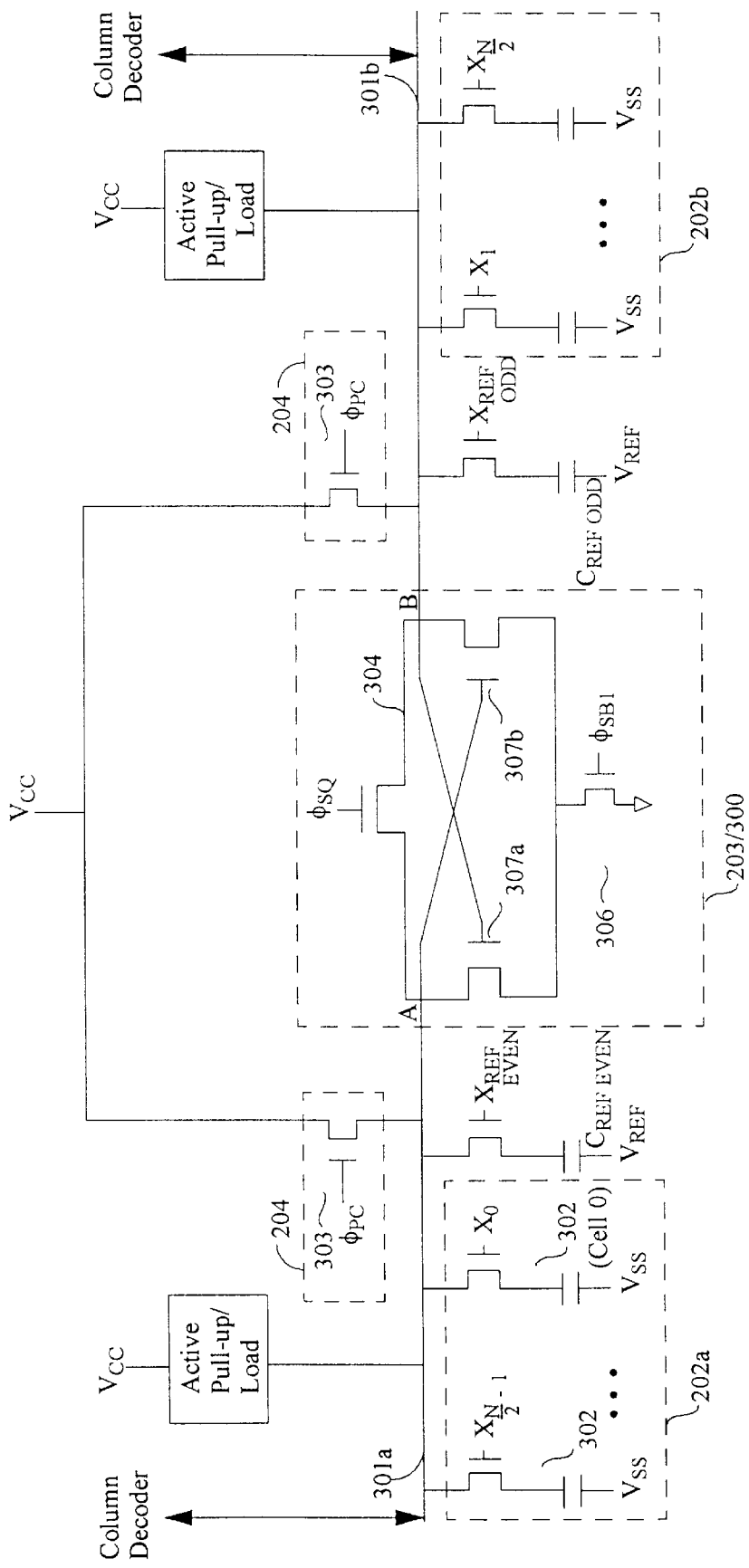
FIG. 3 is an electrical schematic diagram of a first preferred sense amplifier, shown coupled to an exemplary half-bitline pair and exemplary memory cells, embodying the principles of the present invention.

FIG. 3 is a transistor level electrical schematic diagram depicting a representative sense amplifier 300 embodying the principles of the present invention. While the illustrated embodiments herein are constructed from field effect transistors, in alternate embodiments bipolar transistors may be used. Sense amplifier 300 is shown coupled between a corresponding pair of half-bitlines 301a and 301b in an open bitline configuration. In this case, half-bitline 301a is disposed in a corresponding subarray 201a, the cells of which are controlled by the even numbered wordlines $X_0$–$X_{N/2-1}$ (where N=1, 2 . . . , for integer values of N/2–1). Correspondingly, half-bitline 301b is disposed in the associated subarray 201b, the cells of which are controlled by the odd numbered wordlines $X_1$ to $X_{N/2}$ (where N =1, 2 . . . , for integer values of N/2). In alternate embodiments, a folded bitline approach may also be taken. In other words, if a wordline is chosen in the top half, the reference cell in the bottom half is accessed and vice versa.

The precharging of a corresponding half-bitline 301 from the high voltage rail Vcc is controlled by one or more transistors 303 within precharge circuitry 204. There may be one precharge transistor 303 per half-bitline pair 301 or alternatively one large transistor for pulling up all the half-bitlines of each subarray 202. The precharge transistors 303 of the selected bank 201 are turned on and off in response to the precharge enable clock $\Phi_{PC}$.

An equalization device 304 is also provided, controlled by a clock $\Phi_{EQ}$. During precharge, $\Phi_{EQ}$ turns transistor 304 on just before the bitlines are allowed to float. This allows each half-bitline 301a (/BL) and the complementary half-bitline 301b (/BL) of each pair to be voltage equalized as closely as possible.

For a complete description of precharging in sensing in DRAMs, reference is now made to the following papers which are hereby incorporated herein by reference: "*High Speed Sensing Scheme for CMOS DRAMs*", Dhong, et al., IEEE Journal of Solid State Circuits, Vol. 23, No. 1, February, 1988; "*50-ns 16-Mb DRAM with a 10-ns Data rate and On-chip ECC*", Kalter, et al., IEEE Journal of Solid State Circuits, Vol. 25, No. 5, October, 1990; and "*A Variable Precharge Voltage Sensing*", Kirihata, et al., IEEE Journal of Solid State Circuits, Vol. 30, No. 1, January, 1995.

According to one embodiment of the principles of the present invention, sense amplifier 300 has a single amplification stage including a differential pair of transistors 307a and 307b and a "bottom" transistor 306. The gates and drains of transistors 307a and 307b are cross-coupled, with the voltage at sensing node A controlled by the current (source/drain) path of transistor 307a and the voltage at sensing node B is controlled by the current (source/drain) path of transistor 307b. The current flow through transistors 307a and 307b is in turn controlled by bottom transistor 306. Advantageously, the gate of bottom transistor 306 is controlled by a stepped control signal (clock) $\Phi_{SB}$. The operation of sense amplifier 300 and the switching of clock $\Phi_{SB}$ are discussed further below in conjunction with FIG. 4. Preferred methods and circuitry for generating clock $\Phi_{SB}$ is described in copending and coassigned patent application U.S. Ser. No. 08/759,760 (Attorney's Docket No. 2836-P053US), incorporated herein by reference.

Figure 4:
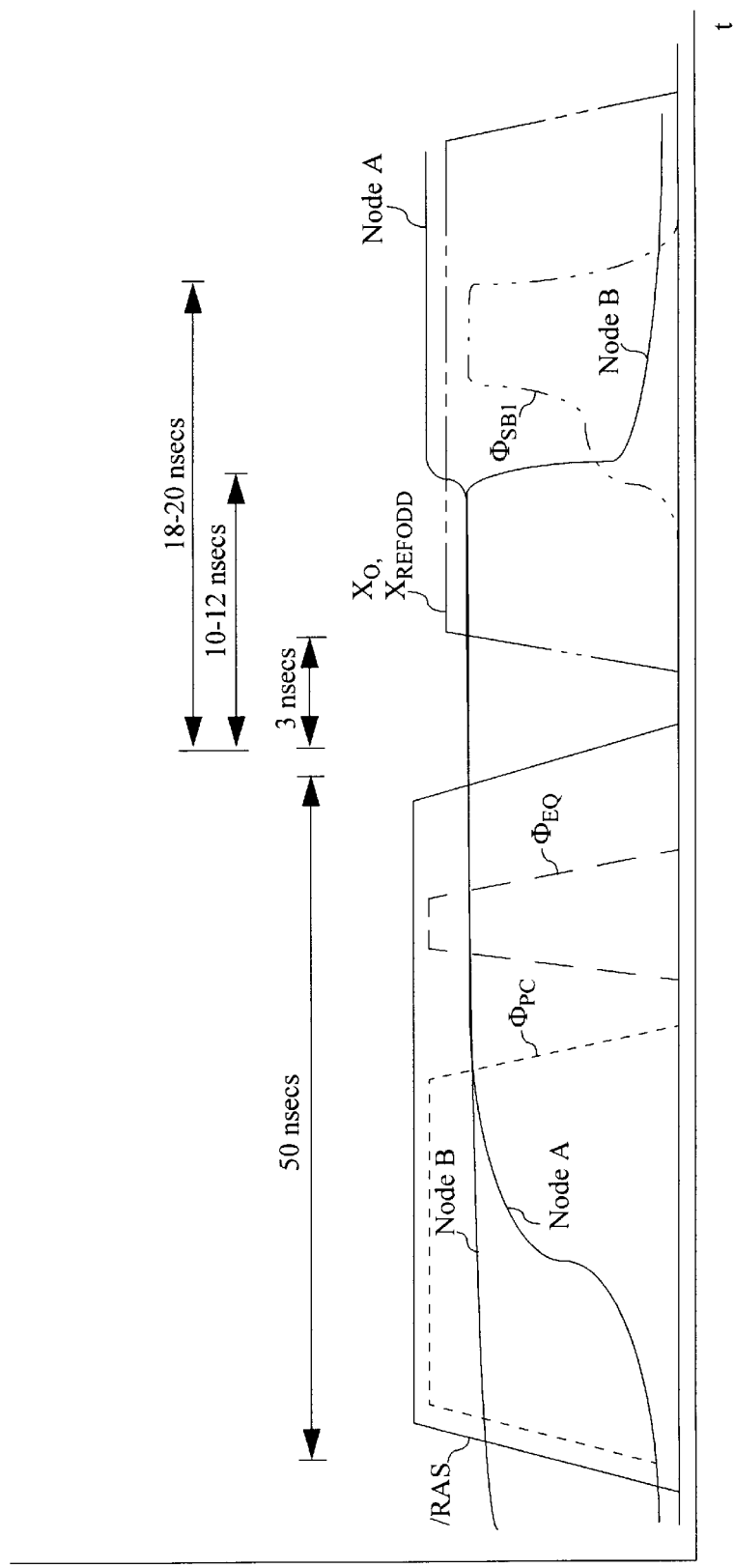
FIG. 4 is a voltage versus time conceptual timing diagram illustrating the operation of the circuitry of FIG. 3 during a typical access.

FIG. 4 is a voltage versus time diagram illustrating the operation of sense amplifier 300 during a typical access cycle. It should be noted that FIG. 4 is a general conceptual timing diagram in which the time and voltage relationships between signals (clocks) are approximated in order to describe circuit operation.

With the rising edge of /RAS, at least one bank 201 enters the precharge period. After short delay, clock $\Phi_{PC}$ transitions high, turning on precharge device(s) 303. For illustration purposes in FIG. 4, it is assumed that after the last cycle bitline 301a and Node A maintained low residual charge from a logic zero and bitline 301b and Node B maintained higher residual charge from a logic high. Half-bitlines 301a and 301b are both charged towards Vcc, along with Nodes A and B. Next, $\Phi_{PC}$ transitions low and shortly thereafter, clock $\Phi_{EQ}$ transitions high. Equalization device 304 turns on voltage equalizing half-bitlines 301a and 301b as closely as possible. After $\Phi_{EQ}$ transitions low, equalization device 304 turns off and half-bitlines 301a and 301b are allowed to float.

With the falling edge of /RAS, a row address (not shown) is latched into the address latches and at least the selected bank 201 enters the active cycle. For purposes of illustration, it will be assumed that row $X_0$ is being accessed. Therefore, after decoding, wordline $X_0$ (an even wordline) and the reference wordline $X_{REFODD}$ coupled to the complementary half-bitline 301b are charged. For discussion purposes, it is assumed that Cell 0 along wordline $X_0$ and column $Y_0$ (i.e., bitline 301 is associated with column 0) being read, and that Cell 0 is storing charge (a logic 1). Thus, with the turn-on of wordline $X_i$, the charge on the capacitor Cell 0 slightly modifies/influences the voltage on bitline 302a (whether the voltage on the bitline increases or decreases, depends on the digital state being detected/ sensed.) Also assume that the reference voltage $V_{REF}$ and the capacitance of the $C_{REFODD}$ are selected to set the voltage on half-bitline 301b at voltage between Vcc and Vss. The voltage half-bitline 301b is selected to provide a voltage at Node B which can be accurately differentially amplified against the voltage of Node A, even if the voltage on the storage Cell 0 has deteriorated. This may be for example Vcc/2, Vcc/3 or 2Vcc/3. The actual selection process is well known in the art and is dependent on a number of factors, such as the fabrication process.

According to the principles of the present invention, a stepped signal $\Phi_{SB1}$ controls the current through bottom transistor 306 and subsequently through the differential pair transistors 307a and 301b. In the initial step, the current through bottom transistor 306 is slowly increased. This is during the period when the voltage difference between Node A and Node B is very small since substantially no amplification has taken place. As bottom transistor 306 slowly turns on, the voltage separation at Nodes A and B is gradually separated (towards $V_{CC}$ and $V_{SS}$).

In the preferred embodiment, signal $\Phi_{SB1}$ includes a second step during which speed and amplification are the key considerations. In other words, during the second step, bottom transistor 306 is rapidly turned on to completion to fully drive Nodes A and B towards the rails (in this case a logic 1 was read from Cell 0 and therefore Node A is driven high and Node B is driven low). Preferably, the second step starts approximately when Nodes A and B are 100 mV apart. It should be noted that, while two steps are shown in the preferred embodiment of FIG. 4, $\Phi_{SB1}$ can be also stepped in three or more steps, as needed for a smooth, accurate splitting of the voltages at Nodes A and B.

Once the differential amplification of the voltage difference between half-bitlines 301a and 301b is substantially complete, the active pull up is activated and then the column decoders for the given bank are activated and the access performed.

At least two substantial advantages are achieved by gradually turning-on bottom transistor 306, in view of the prior art in which the bottom transistor is turned-on in a single, fast step. First, during the initial step, the risk of mis-latching, which otherwise may happen if the bottom transistor is quickly turned-on during the time the voltage difference between Node A and Node B is very small, is substantially reduced. Second, during a fast turn-on, parasitic capacitances in the bottom transistor can couple noise within the sense amplifier and consequently cause mislatching. Among other things, a single large bottom transistor 306 is typically provided per bank; the gate to dram overlap capacitance in such devices being substantial and cause mislatching stated above. By stepping the turn-on of the bottom transistor, these parasitic effects can also be substantially reduced.

Figure 5:
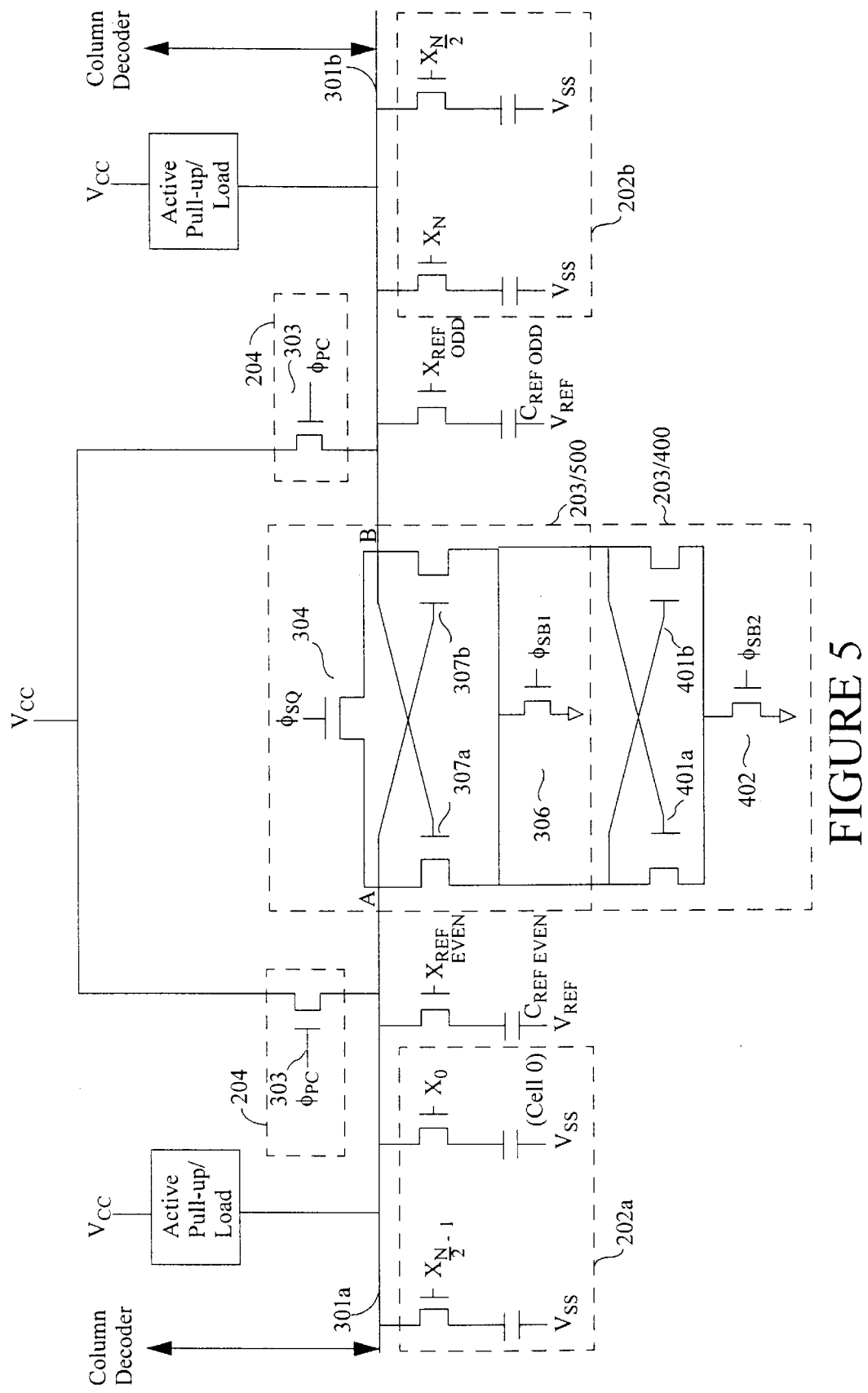
FIG. 5 is an electrical schematic diagram of a second preferred sense amplifier, shown coupled to an exemplary half-bitline pair and exemplary memory cells, embodying the principles of the present invention.

FIG. 5 depicts a second sense amplifier configuration according to the principles of the present invention. In this embodiment, a second amplifier stage 400 is provided. Second stage 400 includes differential pair of transistors 401a and 401b and a bottom transistor 402. The gate of bottom transistor 402 is driven by signal (clock) $\Phi_{SB2}$, which is a stepped signal generated similar to $\Phi_{SB1}$, described in co-pending and coassigned patent application U.S. Ser. No. 759,760 (Attorney's Docket No. 3826-P053US), cited above. Similar to bottom transistor 306 with regards to transistors 307, bottom transistor 402 controls the current through transistors 401a and 401b. This concept is not limited to dual-stage sense amplifier configurations, but may be further extended to three or more stages in a similar fashion.

In the preferred embodiment, the lengths of the transistor channels of differential amplifier transistors 307a and 307b of first stage 300 are at least twice that of the channels of differential amplifier transistors 401a and 401b of second stage 400. The channel width to length ratio of transistors 307 and 401 are preferably on the same order, although the channel width may be varied to vary current drive.

The longer channels of transistors 307a and 307b provide for less gain, but advantageously minimize the threshold voltage and gain imbalance between the two devices. By minimizing the threshold voltage and gain imbalance, the potential for mislatching is further reduced. The higher gain and increased drive is provided by second stage 400.

Figure 6:
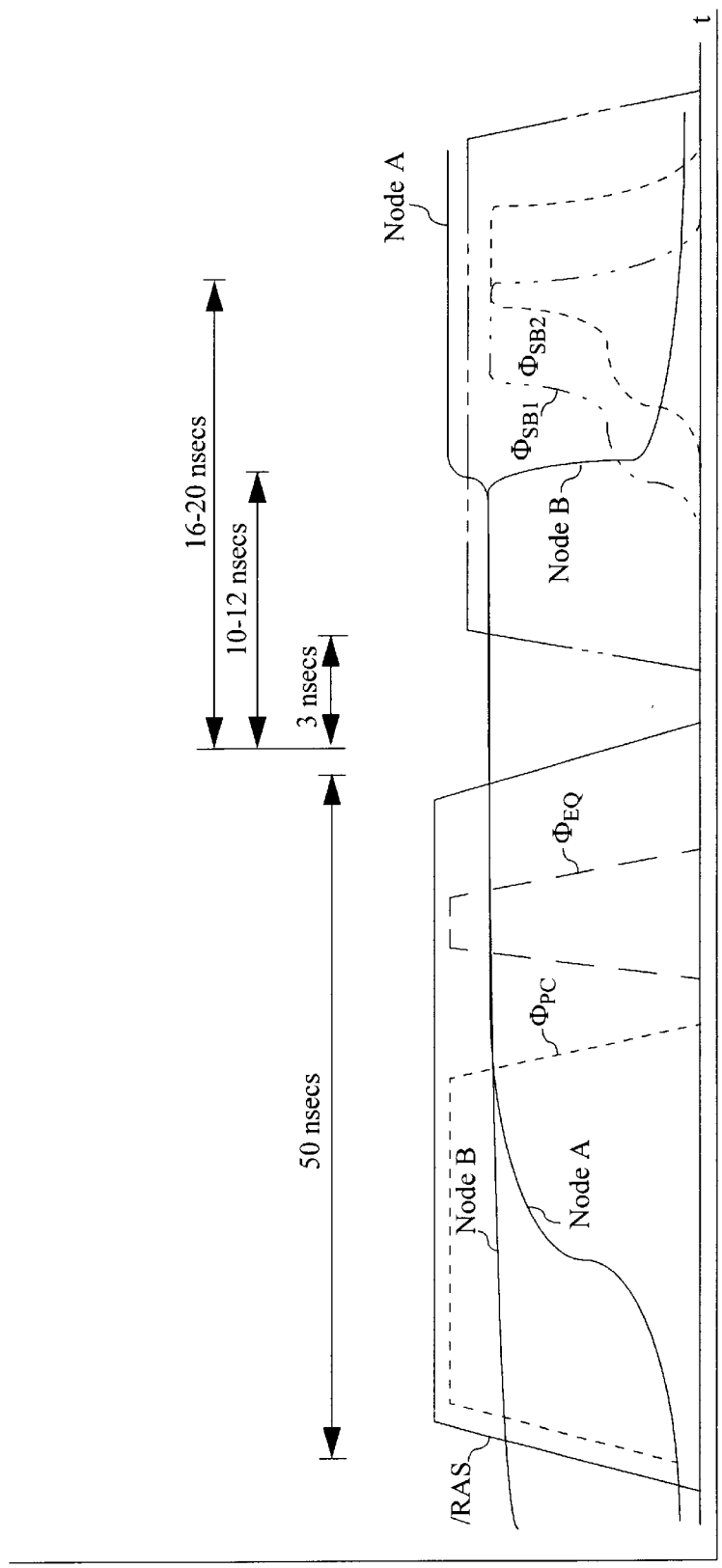
FIG. 6 is a voltage versus time conceptual timing diagram illustrating the operation of the circuitry of FIG. 5 during a typical access.

FIG. 6 is a conceptualized timing diagram similar to FIG. 3. Again, for illustrative purposes, its is assumed that Row 0 is being read, such that Wordline $X_0$ and $X_{REFODD}$ are active. Also, it is assumed for discussion purposes that Node A is carrying a lower and Node B is carrying a higher residual voltage from the previous access cycle. Again, a logic 1 (high) has been written into Cell 0.

The access operation proceeds essentially in the same fashion as in the case of the single stage sense amplifier described above in FIGS. 3 and 4. In this case however, after clock $\Phi_{SB1}$ turns on first stage 300, clock $\Phi_{SB2}$ turns on the second stage. Advantageously, stage 300 splits apart the voltages at Nodes A and B with minimal risk of mislatching and then second stage 300 drives the nodes towards the respective rails. In the preferred embodiment, clock signal $\Phi_{SB2}$ has two steps, with the second step not occurring until after the peak in clock $\Phi_{SB1}$.

According to a further feature of the present invention, the capacitor of each reference (dummy) cell, for example the illustrative capacitors $C_{REFODD}$ or $C_{REFEVEN}$ of FIGS. 3 and 5, may be formed by a plurality of capacitors. As discussed above, the reference cells set the voltage of the half-bitline of each half-bitline pair, which do not include the cells being read (for discussion purposes the "reference half-bitlines"). When the transistor of a given reference cell is turned on, the voltage on the reference half-bitline, floating close to its precharge level, is pulled down to the reference voltage through the reference cell capacitor. By setting the capacitance of the reference cell and/or the reference voltage $v_{REF}$, the voltage on the reference bitline can be appropriately set.

The reference cell capacitors may be formed are formed by a plurality of either series or parallel capacitors, selected generally as a function of the desired reference voltage $v_{REF}$. Preferably, these capacitors are fabricated as stacked capacitors, thereby providing a given capacitance in a smaller surface area.

Figure 7B:
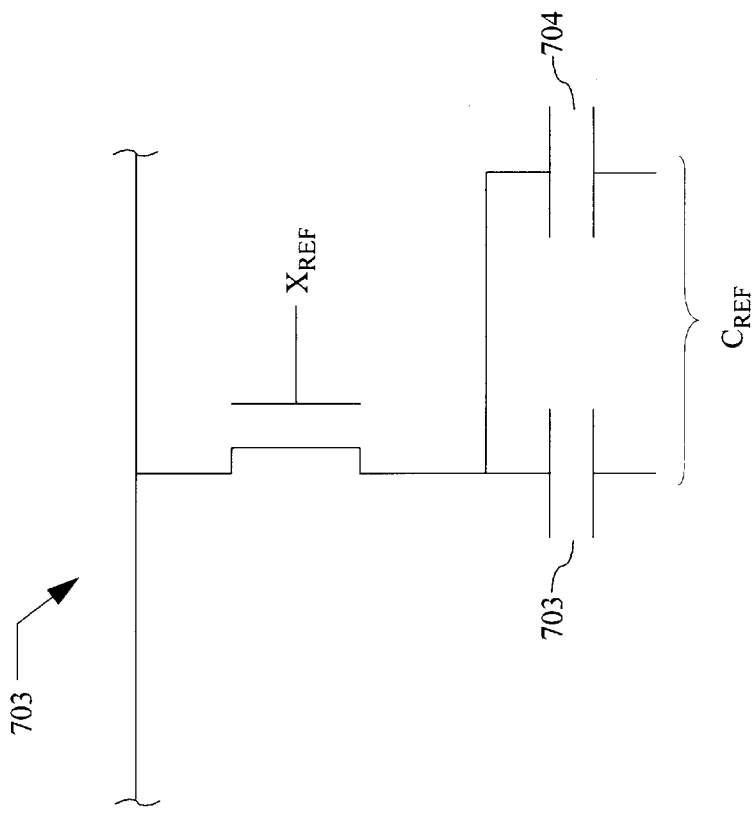
FIGS. 7A and 7B are electrical schematic diagrams of preferred reference cells embodying the principles of the present invention.
Figure 7A:
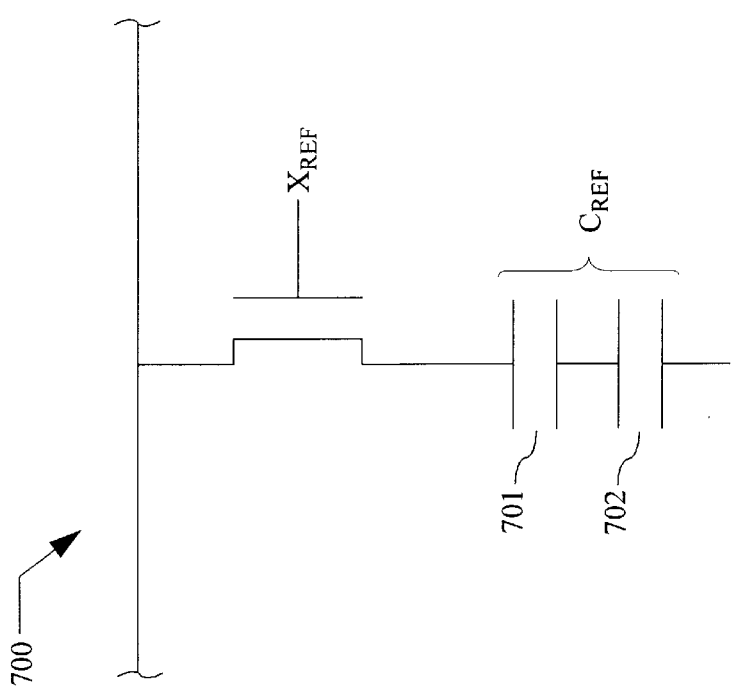

FIG. 7A is a schematic diagram of a reference cell 701 embodying a reference cell capacitor $C^{REF}$ fabricated from two serial capacitors 701 and 702. In this embodiment the capacitors are preferably stacked. The configuration of FIG. 7A is most advantageously employed when a reference capacitor smaller than each of the storage cell capacitors is desired. This case may arise for example, when a fixed reference voltage, such as $V_{REF}=V_{CC}$ has been selected. This concept can be extended to series of three or more capacitors.

In FIG. 7B, a reference cell 703 includes a capacitance $C_{REF}$ provided by parallel capacitors 703 and 703 (as with the example of FIG. 7A, this concept can be extended to three or more capacitors). In this case, capacitors 703 and 704 are preferably stacked to provide a smaller device geometry, although planar capacitors may also be used. The parallel capacitor approach is advantageously used when a larger capacitance and/or a small reference voltage $V_{REF}$ is desired. Further the multiple parallel capacitor approach can advantageously provide for circuit adjustability during manufacturing. For example, a plurality of capacitors can be fabricated in parallel and connected to the reference cell transistor through corresponding programmable devices, such as fuses. To adjust the cell capacitance, one or more selected ones of the parallel are disconnected by using the corresponding programmable device.

Figure 8:
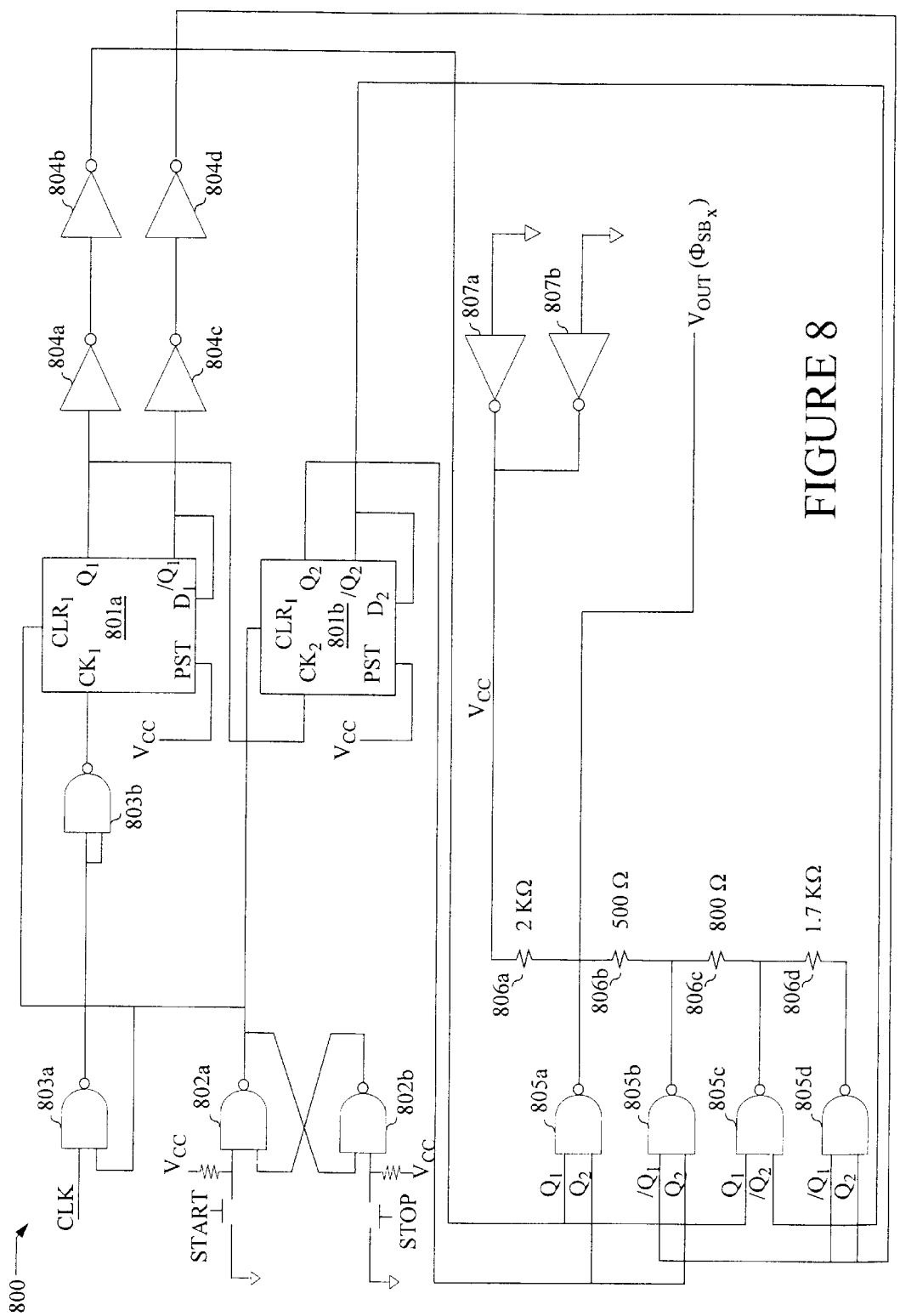
FIG. 8 is a detailed logic diagram depicting a preferred embodiment of the principles of the present invention.

FIG. 8 is a logic diagram of a digital step generator 800 embodying the principles of a more complete invention. Among other things, the step generator 800 is suitable for generating the stepped control signals ($\Phi_{B1}$ and $\Phi_{SB2}$ discussed above. However, it should be noted that step generator 800 can be used in any applications and may be constructed either on chip or from discrete devices, as is known in the art. For purposes of a more complete discussion, it will be assumed that four steps are generated per cycle, although as is discussed below, the present concepts can be extended to circuits generating less than four steps and systems generating more than four steps. Additionally, for purposes of discussion, it will be assumed that $V_{CC}=5$ V, although $V_{CC}$ can be varied from application.

In the illustrated embodiment, step generator 800 includes a pair of flip-flops 801a and 801b which allow for the generation of up to four steps. Alternatively, if only two steps are required, only a single flip-flop is necessary; if more than four steps are required, then the number of flip-flops 801 correspondingly increases. For example, if up to eight steps are desired, three flip-flops 801 would be used.

The clear functions (CLR) of flip-flops 801 are controlled by a latch constructed of cross-coupled NAND gates 802a and 802b. When the STOP function is initiated, the output of nand gate 802a (the latch output) is set low and counting is disabled. When the START function is initiated, the output of nand gate 802a is at a logic high and counting by flip-flops 801 is enabled. In the illustrated embodiment, STOP and START function initiation is by switches and pull-up resistors; in actual embodiments the switches and pull-up resistors may be replaced by other logic circuitry.

Flip-flops 801 increment in response to a clock signal CLK received through driver/buffer NAND gates 803a and 803b and presented to the clock input CK of flip-flop 801a. The true output of flip-flop 801a ($Q_1$) is rippled to the clock input $CK_2$ of flip-flop 801b. By selecting the clock CIK frequency and duty cycle, the width of each step can be set. In the present example, a 2 MHz clock with a 50° duty cycle is assumed.

The true ($Q_1$) and complementary (/$Q_1$) outputs of flip-flop 801a are driven by inverters 804a–804d. Drivers 804 are provided to eliminate a race condition between flip-flops 801a and 801b.

The Q and /Q outputs of flip-flops 801a and 801b, are provided to the inputs of a series of open-drain NAND gates 805a–805d. In the illustrated embodiment, NAND gate 805a is coupled to the true outputs of both flip-flops 801a and 801b (i.e., $Q_1$ and $Q_2$. NAND gate 805b is coupled to the complementary output /$Q_1$ of flip-flop 801a and the true output of $Q_2$ of flip-flop 801b. Conversely, NAND gate 805c receives the output of true output $Q_1$ of flip-flop 801a and the output of complementary output /$Q_2$ from flip-flop 801b. Finally, both the complementary outputs of flip-flops 801a and 801b (i.e. /$Q_1$ and /$Q_2$) are coupled to NAND gate 805d.

The open-drain outputs of NAND gates 805 are coupled to a voltage divider constructed from a series of resistors 806a–806d. The output is $V_{OUT}$ which is tapped from the node between resistors 806a and 806b.

In the illustrated embodiment, the resistors 806 have been selected to provide for steps of zero volts, one volt, two volts, and three volts from a $V_{CC}$ of 5 V. The resistors are driven by a pair of inverters 807a and 807b. In the illustrated embodiment, the resister values have also been selected to limit the output current from between 1 mA for a three volt output and 2.5 mA maximum for a zero volt output.

In alternate embodiments, the values of resistors 806a–806d can be varied as required to set the voltage value of each step as well as to account for differences in system $V_{CC}$. For example, many integrated circuits presently operate off of a 3.3 volt $V_{CC}$ or it may be desirable for each step to be a one-half volt instead of the illustrated one volt. In each case, the resistors would be appropriately changed to adjust the step size and/ or account for a different $V_{CC}$.

The operation of the illustrated embodiment can now be described. Before the next step generation cycle begins, the initiation of the STOP function clears flip-flops 801a and 801b. In the cleared condition, $Q_1$ and $Q_2$ are both at a logic low state and the complementary outputs of /$Q_1$ and /$Q_2$ are consequently in a logic high state. The new step cycle is initiated by the START function, which enables clocking of flip-flops 801a and 801b.

With the first leading (in the preferred embodiment rising) edge of the clock, the $Q_1$ and $Q_2$ outputs of flip-flops 801a and 801b respectively are set to a logic high. In this state, only the open drain output of N gate 805a sinks current, and consequently the first step at the output $V_{OUTPUT}$ is zero volts. In other words, the open-drain output of gate 305a pulls the voltage at $V_{OOT}$ down to substantially zero volts.

With the second leading (rising) edge of the clock, the /$Q_1$ output of flip-flop 801a and the $Q_2$ output of flip-flop 801b switch to a logic high state. In this case, only open-drain output of NAND gate 805b sinks current. The voltage at the $V_{OUT}$ therefore is 500 ohms/2500 kOhms×$V_{CC}$. For the present example, where $V_{CC}$ is five volts, the output voltage at $V_{OUT}$ is consequently one volt.

On the third clock rising edge, the $Q_1$ output of flip-flop 801a and the /$Q_2$ output of flip-flop 801b are set to a logic high state. During this clock period, only the output of open-drain NAND gate 806c is sinking current. In this case, the output is equal to 1300 ohms/3,300 ohms×$V_{CC}$. For the five volt example, the output voltage at $V_{OUT}$ is approximately 2 volts.

On the fourth clock rising edge, the /$Q_1$ output of flip-flop 801a and the /$Q_2$ output of flip-flop 801b are high such that only the output of gate 805d sinks current. The output voltage in this case for a five volt $V_{CC}$ system is approximately 3 volts. In other words, $V_{OUT}$=3,000 ohms/ 5,000 ohms×5 V.

In the preferred embodiment, voltage stepping at the output $V_{OUT}$ is terminated by initiating the STOP function. Alternatively, if the clock input to flip-flops 801 remains enabled, $V_{OUT}$ will recycle downward, in a sequence from three volts to zero volts.

Digital step generators, such as step generator 800, embodying the principles of the present invention, have substantial advantages over the prior art. In particular, such digital step generators provide substantial advantages over currently available analog step generators. Among other things, the speed of the output $V_{OUT}$ is limited only by gate delays. Although not limited to thereto, digital step generators are particularly useful in applications such as the DRAM application discussed above, where speed is critical. Of course, circuits according to the present invention are also ideally suited for other types of mixed signal circuits where fast signals (Digital Switching) and/or precision voltages (Analog Values) are desired. Further the present invention can be embedded on a integrated circuit or constructed from discrete devices. In the case of discrete devices, the voltage values can be adjusted by simple resistor value selection.

Although the present invention and its advantages have been described in detail, it should be understood that various changes, substitutions and alterations can be made herein without departing from the spirit and scope of the invention as defined by the appended claims.

What is claimed is:

1. A step generator for generating a signal for controlling current through a sense amplifier bottom transistor comprising:

a plurality of one drain output logic gates;

a voltage divider having a plurality of nodes each coupled to an output of a corresponding said gate, a selected node of said voltage divider providing an output of said generator; and a flip-flop for presenting a selected one of true and complementary signals to an input of each of said gates to provide a logic low to the corresponding node to initiate current flow through said voltage divider and said open drain gate.

2. The step generator of claim 1 wherein said voltage divider comprises a resistor network.

3. Circuitry for generating voltage steps comprising:

a plurality of logic gates;

a voltage divider having a plurality of nodes, a selected one of said nodes coupled to a open-drain output of a corresponding one of said gates;

a circuit output coupled to a selected one of said nodes of said voltage divider; and a plurality of flip-flops for presenting a plurality of signals to inputs of said logic gates, a selected combination of said signals causing said open-drain output of a selected said gate to sink current from the corresponding node of said voltage divider.

4. The circuitry of claim 3 wherein said plurality of flip-flops comprises:

a first flip-flop having a clock input for receiving a clock, a true output, a complementary output and a data input coupled to said complementary output, said true and complementary outputs of said first flip-flop each providing a one of said signals to a selected one of said gates; and a second flip-flop having a clock input coupled to said true output of said first flip-flop, a true output, a complementary output and a data input coupled to said complementary output of said second flip-flop, said true and complementary outputs of said second flip-flop each providing a one of said signals to a selected one of said gates.

5. The circuitry of claim 4 and further comprising logic circuity for enabling clocking of said flip-flops.

6. The circuitry of claim 5 wherein said first and second flip-flops each have a clear input and said logic is coupled to said clear inputs of said first and second flip-flops.

7. The circuitry of claim 3 and further comprising circuitry for preventing a race condition between said flip-flops.

8. The circuitry of claim 3 wherein said voltage divider operates from either a supply voltage rail or another independent supply voltage to select desired voltage step.

9. A voltage step generator for use in a dynamic random access memory comprising:

n-number of logic gates for generating n-number of voltage steps, each of said gates having an open-drain output, wherein n is a positive integer;

a voltage divider coupled to a preselected supply voltage and having n-number of nodes, each of said nodes coupled to said open-drain output of a corresponding one of said gates, resistive values of said divider preselected to provide voltage steps of preselected voltages when current is sunk by a selected one of said gates;

a plurality of flip-flops for sequentially generating at least n-number of sets of signals, each said set of signals causing said open-drain output of a selected one of said gates to sink current from the corresponding one of said nodes of said voltage divider; and a generator output coupled to a selected one of said nodes of said voltage divider.

10. The voltage step generator of claim 9 wherein said plurality of flip-flops comprises m-number of flip-flops, and n steps, wherein $n=2^m$.

11. The voltage step generator of claim 9 wherein said voltage divider comprises a resistor network, each said node disposed between selected resistors of said resistor network.

12. The voltage step generator of claim 9 wherein said gates comprise NAND gates.

13. A sense amplifier comprising:

a first transistor having a current path coupled to a first sensing node and a control terminal coupled to a second sensing node;

a second transistor having a current path coupled to said second sensing node and a control terminal coupled to said first sensing node;

a bottom transistor having a current path coupled to said current paths of said first and second transistors and a control terminal; and a stepped voltage generator coupled to said control terminal of said bottom transistor, said stopped voltage generator comprising:

a plurality of logic gates each having an open-drain output;

a voltage divider coupled to said open-drain output of said gates and a voltage source, a selected node of said voltage divider providing an output of said generator; and circuitry for presenting a selected one of true and complementary signals to an input of each of said gates.

14. The sense amplifier of claim 13 wherein said circuitry for presenting comprises at least one flip-flop.

15. The sense amplifier of claim 13 wherein at least one of the gates comprises a NAND gate.

16. The sense amplifier of claim 13 wherein said voltage divider comprises a resistor network.

17. The sense amplifier of claim 13 wherein said control terminal of said bottom transistor is coupled to a selected said node of said voltage divider.

* * * * *